United States Patent
Bernier et al.

(10) Patent No.: US 6,921,015 B2
(45) Date of Patent: Jul. 26, 2005

(54) SOLDER PROTECTIVE COATING AND FLUXLESS JOINING OF FLIP CHIP DEVICES ON LAMINATES WITH PLATED SOLDER

(75) Inventors: William E. Bernier, Endwell, NY (US); Donald W. Henderson, Ithaca, NY (US); James Spalik, Kirkwood, NY (US); Isabelle Paquin, Bromont (CA)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 10/417,690

(22) Filed: Apr. 17, 2003

(65) Prior Publication Data

US 2003/0178473 A1 Sep. 25, 2003

Related U.S. Application Data

(62) Division of application No. 09/687,524, filed on Oct. 12, 2000, now Pat. No. 6,585,150.

(51) Int. Cl.⁷ ............................................. B23K 31/02
(52) U.S. Cl. .................................. 228/180.22; 228/214
(58) Field of Search ................................ 228/214, 223, 228/180.21, 180.22; 427/96; 29/840; 361/743, 767, 808; 148/23, 24

(56) References Cited

U.S. PATENT DOCUMENTS

| | | | |
|---|---|---|---|
| 2,726,215 A | 12/1955 | Jones | |
| 5,085,365 A | 2/1992 | Turner | |
| 5,092,843 A | 3/1992 | Monroe et al. | |
| 5,443,660 A | 8/1995 | Gao et al. | |
| 5,447,577 A | 9/1995 | Gao et al. | |
| 5,507,882 A * | 4/1996 | Bristol et al. | 148/23 |
| 5,514,414 A * | 5/1996 | Gao et al. | 427/255.6 |
| 5,531,838 A | 7/1996 | Arldt et al. | |
| 5,615,827 A | 4/1997 | Arldt et al. | |
| 5,851,311 A * | 12/1998 | Diamant et al. | 148/23 |
| 5,958,151 A | 9/1999 | Gao et al. | |
| 6,059,894 A * | 5/2000 | Pendse | 148/23 |
| 6,217,671 B1 * | 4/2001 | Henderson et al. | 148/23 |

\* cited by examiner

Primary Examiner—Jonathan Johnson
(74) Attorney, Agent, or Firm—Scully, Scott, Murphy & Presser; William H. Steinberg, Esq.

(57) ABSTRACT

A method for protecting tin oxide coated solder surfaces against further oxidation and a method for fluxless solder joining of such surfaces is provided.

10 Claims, 1 Drawing Sheet

SOLDER PROTECTIVE COATING AND FLUXLESS JOINING OF FLIP CHIP DEVICES ON LAMINATES WITH PLATED SOLDER

CROSS REFERENCE TO APPLICATION

This application is a divisional application of Ser. No. 09/687,524, filed Oct. 12, 2000 now U.S. Pat. No. 6,585,150.

FIELD OF THE INVENTION

The invention relates to the fluxless joining of flip chip devices on laminates with plated solder. The invention also relates to the protection of such solder joinable surfaces against excess oxidation.

BACKGROUND OF THE INVENTION

Fluxes are commonly reacted with surface oxides, such as tin oxide, during the reflow process to generate metal surfaces which subsequently intermix forming a solder joint. Problems in fluxing and soldering can arise in which inadequate amounts of flux or excessive thicknesses of tin oxide are present either or both of which can inhibit wetting and intermixing and result in the formation of non wetted, electrically open solder joints. In addition, where excess flux may be incompletely consumed in the reflow process. The remaining residues will interfere with the efficiency of subsequent process steps such as chip underfill.

Routinely, tin oxide is controlled by multiple reflows of solder in the presence of flux which subsequently must be removed, either by aqueous, organic solvent, or gaseous cleaning. The newly-cleaned surfaces are now subject to reoxidation by exposure to ambient air, thus the thickness of tin oxide layer may vary unacceptably in an uncontrolled manner.

Currently a variety of flux types, both those that do not require a separate cleaning step, no clean, and types that are removed by aqueous, or organic solvent washing are employed in the electronics industry. These fluxes introduce residues onto laminate, solder joint and chip surfaces which can inhibit proper underfill flow required for subsequent mechanical stability of the solder joints.

SUMMARY OF THE INVENTION

This invention selectively precoats the solder surfaces of either the chip, the laminate, or both with a metal-complexing agent in a flux which reacts with the tin oxide in order to control the reactivity of tin at the solder surface. This complexing agent forms a continuous thin metal carboxylate film on the solder surfaces and protects the solder surface from further oxide formation. In this form the chips and laminates may be handled in a routine manner without particular concern for oxide thickness growth as long as mechanical damage to the solder surfaces is avoided. When ready for joining the chip solder bumps and laminate solder pads are brought into intimate contact and subjected to reflow temperatures. The tin carboxylate complex facilitates solder reflow, but moreover, when exposed to peak reflow temperatures, decomposes into volatile products, leaving a clean surface easily wetted by the solder.

This invention may be carried out applying additional flux just prior to reflow, or the additional flux application may be omitted resulting in a fluxless joining process. Where the flux is omitted, the treated chips or laminates, now having protected surfaces, may be safely stored for later final assembly. Advantages of the invention include control of the tin oxide formation prior to chip joining, handling improvement, opportunity for fluxless joining and elimination of residues after reflow promoting underfill adhesion.

The invention provides a method of protecting tin solderable surfaces. To a solderable surface, coated with tin oxide, a complexing agent is applied. The complexing agent is, a dicarboxylic acid, for example, pimelic acid. Heating drives the formation of tin pimelate which forms a tenacious film over the solder surface protecting it from reacting further with ambient oxygen. The protective agent, tin pimelate in this example, also prevents the oxidation of Sn(II) to Sn(IV). Sn(IV) is well known to be difficult to complex and to inhibit the solder process.

The invention provides a means of generating clean metal surfaces for solder joining without incurring problems associated with the use of customary flux. An aspect of the invention is that the temperatures associated with reflow decompose the protective agent to volatile materials, in the present example, tin pimelate is decomposed to cyclohexanone and $CO_2$. The decomposition results in a clean surface.

An additional aspect of the invention is provision of means of protection against oxidation of solderable surfaces during storage awaiting final assembly.

Yet a further aspect of the invention is provision of means by which flux contamination of extraneous surfaces is prevented. The present invention eliminates the need for flux, usually required for multiple reflow steps, and minimize the further growth of the tin oxide layer. The present invention substantially eliminates flux residues since the decomposition products are gaseous.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity.

DETAILED DESCRIPTION OF INVENTION

Figure 1:
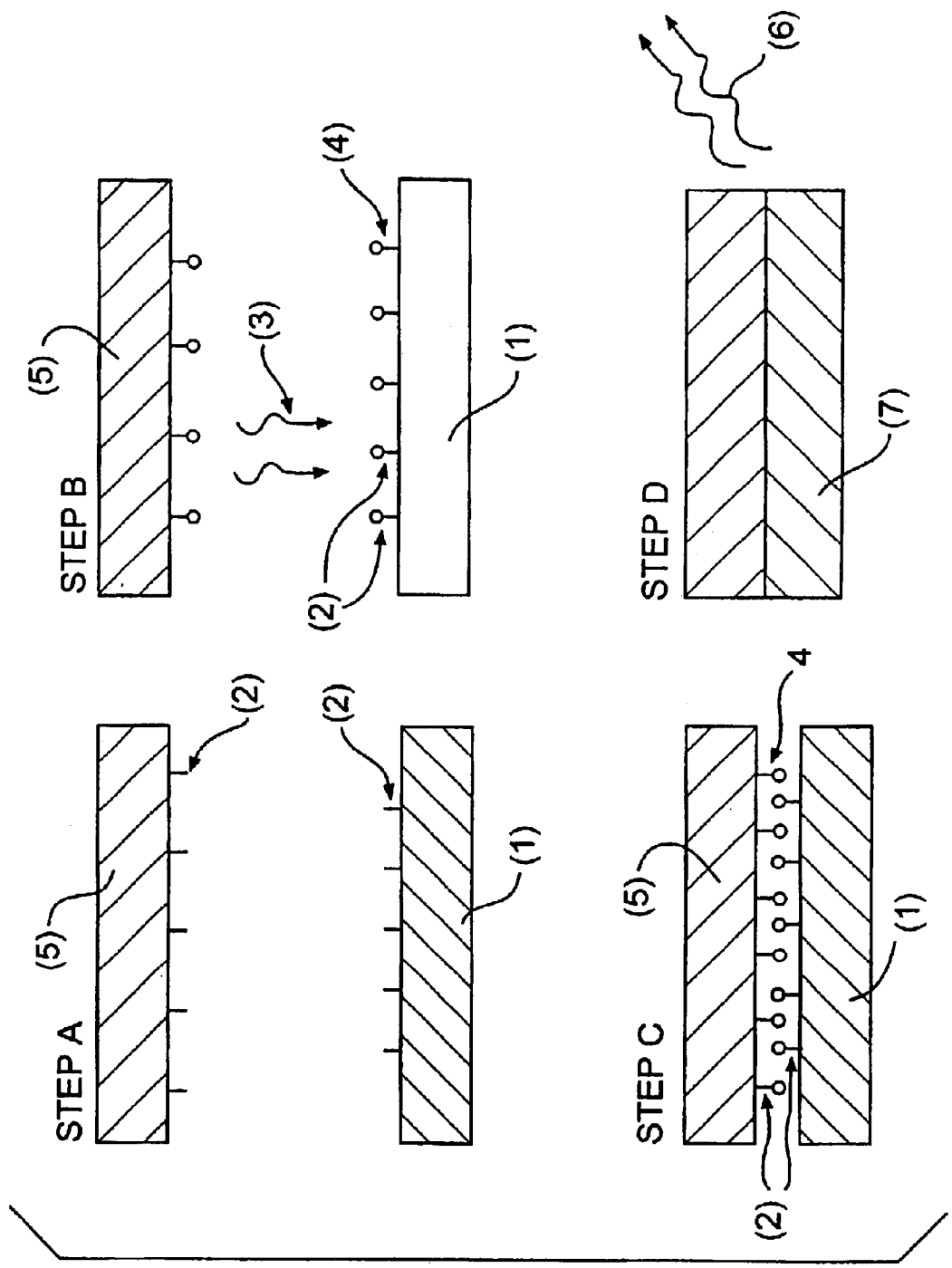
FIG. 1 is a schematic outlining the steps of the method.

Reference is made to the figures to illustrate selected embodiments and preferred modes of carrying out the invention. It is to be understood that the invention is not hereby limited to those aspects depicted in the figure.

In Step A, a first tin solderable surface 1 and a second tin solderable surface 5, each of the surfaces having a natural film of tin oxide 2 thereon, are provided. In Step B, a complexing agent 3 is applied. In some embodiments of the invention, the complexing agent is pimelic acid applied from a vapor phase. The complexing agent forms an addition product 4 with the oxide coating, in some embodiments, a cyclic tin pimelate product. In some embodiments of the invention, the parts, with solder joinable surfaces protected by the addition product, are stored for later final assembly. Step C intimately contacts the first and second surfaces. In Step D, reflow conditions are applied, forming a solder joint, decomposing the addition product to volatile materials 6.

In those embodiments wherein the complexing agent is applied from the gas phase, without using flux, the parts may be stored for later assembly. Such gas phase embodiments are considered examples of the best mode of employing the invention. In such embodiments, the complexing agent may be a dicarboxylic acid that decomposes to volatile products when exposed to solder reflow conditions. Non-limiting examples of suitable dicarboxylic acids include adipic acid, pimelic acid, sebacic acid, and other dibasic acids.

According to certain embodiments of the invention, the first tin-solderable surface is a chip solder bump surface and the second tin-solderable surface is a laminate solder pad.

In some embodiments of the invention, the complexing agent comprises EN92 flux as described in U.S. Pat. Nos. 5,615,827 and 5,531,838 assigned to the assignee of the present invention the disclosure of which is hereby incorporated by reference. In such embodiments, the treated parts are not stored, but reflow occurs substantially immediately after application of complexing agent. In other embodiments wherein reflow occurs substantially immediately after application of complexing agent, the complexing agent may comprise a mixture comprising suitable flux and any of adipic acid, pimelic acid, sebacic acid, or any other dicarboxylic or dibasic acid that decomposes to volatile products when exposed to reflow conditions. Reflow conditions comprise temperatures of about 220° C. Appropriate amounts of flux and complexing agents are as described in the above referenced patents.

It will, therefore, be appreciated by those skilled in the art having the benefit of this disclosure that this invention is capable of producing various tin carboxylate coatings on tin-solderable surfaces. It will be further appreciated that such coatings provide protection against further oxidation of such treated surfaces. Moreover, it will be appreciated that such surfaces are in a state suitable for solder joining under reflow conditions. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method of fluxlessly joining tin-solderable surfaces comprising:

providing a first tin-solderable surface and a second tin-solderable surface, each said surface having tin oxide thereon, said first tin-solderable surface being a chip solder bump surface; and said second tin-solderable surface comprising a laminate solder pad;

applying a complexing agent adapted to form a reaction product with tin to said at least one tin-solderable surface;

forming said reaction product with said tin oxide and said complexing agent, wherein said reaction product decomposes to tin oxide and volatile products upon being exposed to reflow conditions;

intimately contacting said first tin-solderable surface with said second tin-solderable surface; and reflowing said first and said second contacted tin-solderable surfaces.

2. A method of joining tin-solderable surfaces, according to claim 1, wherein forming said reaction product with said tin oxide and said complexing agent comprises heating.

3. A method of joining tin-solderable surfaces, according to claim 1, wherein said complexing agent comprises pimelic acid.

4. A method of joining tin-solderable surfaces, according to claim 1, wherein said complexing agent further comprises flux.

5. A method of joining tin-solderable surfaces, according to claim 1, wherein said complexing agent is a dicarboxylic acid.

6. A method of joining tin-solderable surfaces, according to claim 1, wherein said reaction product comprises tin pimelate.

7. A method of joining tin-solderable surfaces, according to claim 1, wherein said reaction product comprises tin dicarboxylate.

8. A method of joining tin-solderable surfaces, according to claim 1, wherein said reaction product decomposes to volatile products where subject to reflow temperatures.

9. A method of joining tin-solderable surfaces, according to claim 1, wherein said complexing agent and tin react to form tin carboxlyate.

10. A method of joining tin-solderable surfaces, according to claim 1, wherein applying complexing agent comprises vapor phase deposition of complexing agent.

* * * * *